United States Patent [19]

Cattaneo

[11] Patent Number: 4,682,101
[45] Date of Patent: Jul. 21, 1987

[54] CURRENT TRANSFORMER FOR DIRECT AND ALTERNATING CURRENT

[75] Inventor: Pierre Cattaneo, Collonges, France

[73] Assignee: Lem S.A., Geneva, Switzerland

[21] Appl. No.: 821,976

[22] Filed: Jan. 24, 1986

[30] Foreign Application Priority Data

Feb. 5, 1985 [CH] Switzerland .................. 00499/85

[51] Int. Cl.$^4$ .................. G01R 33/00; G01R 19/00; G05F 1/325; H01F 40/06
[52] U.S. Cl. .................. 324/117 H; 324/117 R; 324/127; 323/250; 323/357
[58] Field of Search .............. 324/117 H, 117 R, 127, 324/251; 338/32 H; 336/212; 323/357, 368, 250; 310/DIG. 3

[56] References Cited

U.S. PATENT DOCUMENTS 3,525,041 8/1970 Velsink .................. 324/127
4,482,862 11/1984 Leehey .................. 324/117 R Primary Examiner—Reinhard J. Eisenzopf
Assistant Examiner—Vinh P. Nguyen
Attorney, Agent, or Firm—Anthony A. O'Brien

[57] ABSTRACT

Two ferromagnetic cores (11, 12) are provided for a transformer, only one of the cores (11) exhibits an air gap (13) in which a Hall effect element (3) is housed. The current flowing in a conductor (10) can be direct or alternating current and induces in the core (11) a corresponding magnetic field which makes it possible to obtain a signal on the element (3). This signal is amplified by an amplifier (8). The output current from amplifier (8) is applied to a winding wound around both cores (11, 12). For direct current and low frequency current, the winding current is proportional to the current in conductor (10). When the frequency of the current flowing through conductor (10) exceeds a certain value (several kHz), the gain of the amplifier (8) diminishes. A linear relationship between the conductor current and the current in the winding is maintained, however, because the high frequency is transmitted to the winding by the core (12).

3 Claims, 4 Drawing Figures

CURRENT TRANSFORMER FOR DIRECT AND ALTERNATING CURRENT

Current transformers for direct and alternating currents are already known comprising a magnetic circuit consisting of a core having an air gap and carrying two windings, an element sensitive to the magnetic field prevailing in the air gap, this element providing an electric signal dependent on the magnetic field, an amplifier controlled by said signal, this amplifier feeding one of the two windings in such a direction that it tends to cancel the magnetic field which gives rise to said electric signal, a current measuring device being connected in series with the winding fed by the amplifier.

Transformers of this type provide complete satisfaction for measuring direct currents and for alternating currents of relatively low frequency. However, when the frequency of the alternating currents increase, the response of the system diminishes mainly because of the leakage flux due to the air gap, on the one hand, and as a function of the frequency response of the amplifier, on the other hand.

This invention has its object to improve the dynamic performances of current transformers of said type. This result is obtained thanks to the fact that the magnetic circuit comprises a second ferromagnetic core not having an air gap, this second core being coupled magnetically to the first core by said windings.

The accompanying drawing shows a known device and, by way of example, an embodiment of the device that is the object of the invention.

Figure 1:
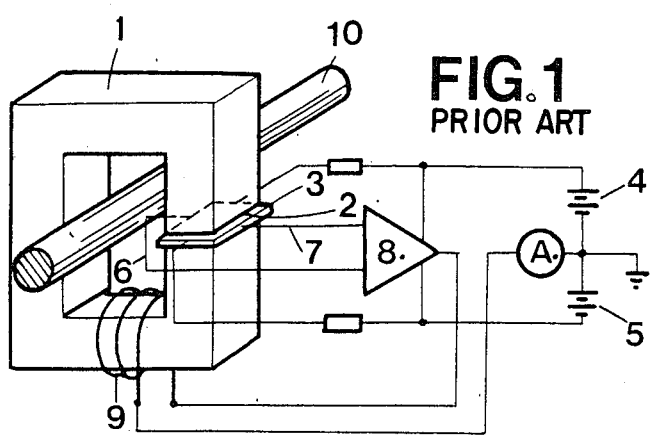
FIG. 1 represents the known device.

In the known device, illustrated in FIG. 1, a transformer consists of a rectangular-shaped ferromagnetic core 1. This core 1 exhibits an air gap 2 in which an element 3 sensitive to the magnetic field prevailing in this air gap is placed. This element 3 can particularly consist of a Hall-effect cell. This cell is fed by a current supplied by two batteries 4 and 5 mounted in series and whose connection point is grounded. When cell 3 is placed in a magnetic field crosswise to its plane, it gives rise to a voltage between two electrodes 6 and 7 placed perpendicular in relation to the current which goes through it. This voltage is applied to an amplifier 8 whose gain is very high and whose output feeds a secondary winding 9 which surrounds core 1. In the drawing, this winding 9 has been represented on a branch different from the one containing cell 3 for more clarity, but as a rule, this secondary winding is placed on the branch in which cell 3 is found.

As soon as a magnetic field acts on cell 3, the amplifier causes the flow, in winding 9, of a current which must cancel its magnetic field producing said voltage and due to the flowing of the current in a primary winding 10 which consists more often of a simple rectilinear conductor. The current flowing in secondary winding 9 is measured by an ammeter A, which gives an indication proportional to the current flowing in primary winding 10.

Figure 3:
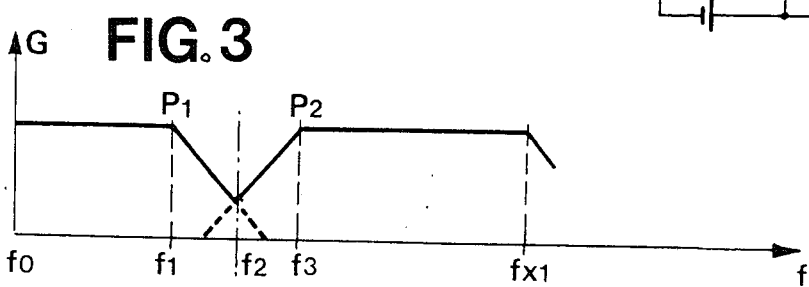
FIG. 3 is a diagram of the response curve of the transformer of FIG. 1.
Figure 4:
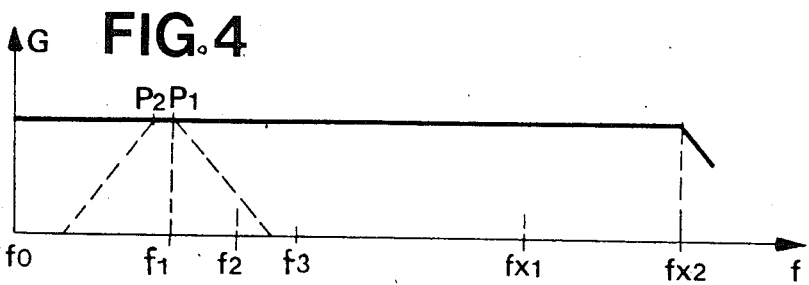
FIG. 4 is a diagram of the response curve of the transformer of FIG. 2.

Three operating states can be distinguished. They are shown diagrammatically by FIG. 3.

(a) Static or slightly dynamic state, from f0 to f1:

In this case the amplifier calls for the fundamental relation of perfect transformers, applicable even for direct currents. The flux in the magnetic core is zero, the ampere-turns going through the secondary winding are equal to the ampere-turns of the primary winding.

(b) Transition state, from f1 to f3, delimited by poles p1 and p2:

Zone f1 to f2 is due to the frequency gain transfer characteristic of the amplifier. Zone f2 to f3 is characterized by the weakening of the secondary signal at low frequencies due to the presence of the air gap.

(c) Dynamic state from f3 to fx1:

The unit behaves like a current transformer.

Figure 2:
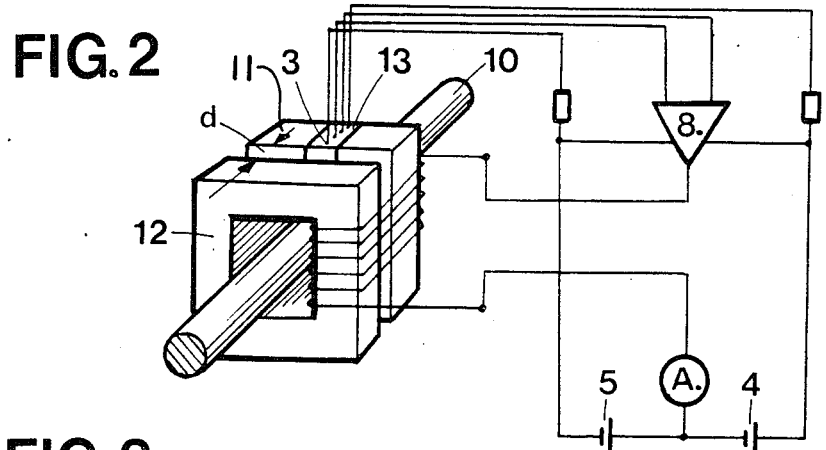
FIG. 2 represents said embodiment.

FIG. 2 illustrates diagrammatically an embodiment of the transformer that makes possible much higher dynamic performances. For this purpose, the transformer comprises two ring-shaped magnetic cores 11 and 12 placed side by side. Core 11 exhibits an air gap 13 in which a Hall-effect cell is placed, such as element 3 of FIG. 1. This cell is fed by batteries 4 and 5 and its output drives a high-gain amplifier 8. Core 12 is separated form core 11 by a value sufficient to prevent it from magnetically short-circuiting the magnetic field in air gap 2.

Ferromagnetic core 12 does not have an air gap and it is dimensioned to provide a correct response from a frequency lower than f1 and up to a frequency fx2.

In summary, pole p2, corresponding to the lower cutoff frequency of the current transformer itself, formed by ferromagnetic core 12 and the windings, is located at a frequency lower than pole p1, corresponding to the cutoff frequency of the amplifier. Thus, the cutoff frequency of the unit is linear from f0 to fx2 which is greater than the frequency fx1 of the known device.

Of course, numerous variant embodiments can be provided. Actually, the ferromagnetic cores do not necessarily have to be ring shaped or be placed side by side. According to a variant, one of the cores could be placed inside the other, which gives a compact design. It is also possible to provide that magnetic circuit 12 can consist of two ferromagnetic cores placed coaxially and on both sides of core 11 with air gap.

I claim:

1. A current transformer for measuring direct and alternating currents in a conductor, comprising:
a magnetic circuit including a first ferromagnetic core and a second ferromagnetic core magnetically coupled to said first core, said cores being disposed about the conductor so that a magnetic field is induced in said cores by the current in said conductor, only said first core having an air gap and a Hall effect element positioned within said air gap for producing an electric signal dependent on the magnetic field induced in said first core, a winding wound about at least said first core, an amplifier connected to receive said electric signal as an input, said amplifier producing an output signal, means for applying said output signal to said winding in a direction tending to cancel the magnetic field induced in said cores by the conductor, and a current measuring device connected in series with said winding for measuring the current in said winding, which is proportional to the current in the conductor.

2. The transformer as claimed in claim 1, wherein said cores are ring-shaped and positioned in coaxially alignment with respect to one another.

3. The transformer as claimed in claim 2, wherein said cores each have inner and outer dimensions that are approximately equal to each other and said cores are positioned side by side, and said winding being a coil wound around both said cores to magnetically couple said cores together.

* * * * *